(12) United States Patent
Liu

(10) Patent No.: US 12,034,270 B1
(45) Date of Patent: Jul. 9, 2024

(54) LASER POINTER

(71) Applicant: Danlin Liu, Sichuan (CN)

(72) Inventor: Danlin Liu, Sichuan (CN)

( * ) Notice: Subject to any disclaimer, the term of this patent is extended or adjusted under 35 U.S.C. 154(b) by 0 days.

(21) Appl. No.: 18/488,881

(22) Filed: Oct. 17, 2023

(51) Int. Cl.
*H01S 5/0239* (2021.01)
*F21L 4/08* (2006.01)
*H01S 5/026* (2006.01)

(52) U.S. Cl.
CPC .......... *H01S 5/0239* (2021.01); *H01S 5/0261* (2013.01); *F21L 4/08* (2013.01)

(58) Field of Classification Search
CPC ..................................................... H01S 5/0239
USPC .......................................................... 372/109
See application file for complete search history.

(56) References Cited

U.S. PATENT DOCUMENTS

| | | | | | |
|---|---|---|---|---|---|
| 3,544,718 | A | * | 12/1970 | Adler | H04N 5/84 386/221 |
| 3,773,410 | A | * | 11/1973 | Carrara | G03B 35/24 352/129 |
| 4,620,266 | A | * | 10/1986 | Baumann | G03B 21/20 362/433 |
| 5,121,188 | A | * | 6/1992 | Patridge | G02B 6/4204 257/680 |

* cited by examiner

*Primary Examiner* — Tuan N Nguyen

(57) ABSTRACT

A handheld USB wireless charging high power laser pointer with variable patterns is disclosed, including a laser pointer body, a wireless charging mechanism, and a pattern changing mechanism. The laser pointer body is configured to be fitted with a protective shell at one end, the wireless charging mechanism includes an USB charging interface. The device of the present disclosure facilitates charging of the laser pointer body, and meanwhile, a pattern film is provided at one end of the protective shell, which facilitates changing of the pattern to satisfy uses.

4 Claims, 5 Drawing Sheets

LASER POINTER

TECHNICAL FIELD

The present application relates to the technical field of laser pointers, and more specifically to a handheld USB wireless charging high power laser pointer with variable patterns.

BACKGROUND

Laser pointer is a laser diode that has red, blue, green, and violet ray types for reporting, teaching, tour guiding, astronomy, and more.

Currently, the laser pointer on the market is charged either with a battery, or with a charging cable, which is more troublesome, the function is relatively single, and the pattern can not be changed, thus there is an urgent need to propose a handhold USB wireless charging high power laser pointer that can change the pattern to solve above problems.

SUMMARY

In order to remedy above deficiencies, the present disclosure provides a handheld USB wireless charging high power laser pointer with variable patterns to address the above problems or at least partially solves the above problems.

Specifically, the present disclosure accomplishes the above objectives by providing following technical solutions.

In some embodiments of the present disclosure, a handheld USB wireless charging high power laser pointer with variable patterns is provided, including a laser pointer body configured to be fitted with a protective shell at one end. The protective shell has a rectangle shape, and a second magnet is embedded internally into one side of the protective shell. The laser pointer body is internally fixedly connected to a circuit board, the circuit board is electrically connected to a storage battery and a lamp base.

In some embodiments of the present disclosure, the handheld USB wireless charging high power laser pointer with variable patterns further includes a wireless charging mechanism. The wireless charging mechanism includes an USB charging interface, the laser pointer body is internally fixedly connected to a storage battery, and the storage battery is electrically connected to the USB charging interface.

In some embodiments of the present disclosure, the handheld USB wireless charging high power laser pointer with variable patterns further includes a pattern changing mechanism, and the pattern changing mechanism includes a roller and a pattern film. Herein the protective shell is configured to be fixedly connected to a diaphragm at one end face, and the diaphragm is rotationally connected to the roller at an inner side. The pattern film is configured to be winded around an outer surface of the roller, and the pattern film is configured to correspond to a position of one end of the protective shell.

In some embodiments of the present disclosure, the first magnet corresponds to the second magnet in position, and the first magnet and the second magnet have opposite magnetic poles.

In some embodiments of the present disclosure, one end of the roller is fixedly connected to a strut, and the strut is configured to run through an interior of the diaphragm and fixedly connected to a rotating disk. Herein, by designing one end of the roller to be fixedly connected to the strut, and one end of the strut to be fixedly connected to the rotating disk, which is convenient to control rotations of the rotating disk, then it can control rotations of the roller, and thus realizing changes of patterns to satisfy actual uses.

In some embodiments of the present disclosure, one end of the laser pointer body is threaded to a protective cover, threaded rings are provided on an inner wall of the protective cover, and the protective cover covers an exterior of the USB charging interface. Herein, by designing one end of the laser pointer body to be threaded with the protective cover, the USB charging interface can be protected from damage and prolonged use.

In some preferred embodiments of the present disclosure, the laser pointer body is fixedly connected to a rectangular plate on an outer surface of one end, and the laser pointer body runs through an interior of the rectangular plate. Herein, by designing the outer surface of one end of the laser pointer body to be fixedly connected to the rectangular plate, which facilitates installation of the protective shell and can stabilize the protective shell on the laser pointer body, and thus realizing changes of patterns to satisfy actual uses.

In some preferred embodiments of the present disclosure, the rectangular plate is configured with grooves at positions of four corners on one side, and a first magnet is fixedly connected to an inside of the grooves. Herein, by designing the one side of the rectangular plate to mount the first magnet, and the first magnet and the second magnet to be attracted to each other, the protective shell can be stably mounted on the rectangular plate for stable use.

The handheld USB wireless charging high power laser pointer with variable patterns of the present disclosure at least includes following advantages.

1. By fixing with the USB charging interface at the one end of the laser pointer body, it is convenient for charging, thus can effectively replace the way of filling batteries or charging with the charging cable, and can facilitate charging operations. Moreover, by fixed installation of the diaphragm at the one end of the protective shell, the roller is rotationally connected to the one side of the diaphragm, the pattern film is winded around the outer surface of the roller, and the pattern film is moved by controlling the rotation of the roller, so as to change the pattern and satisfy actual uses.

2. By fixedly attaching the rectangular plate on the outer surface of the laser pointer body, the first magnet is fixedly mounted on the one side of the rectangular plate, meanwhile the protective shell is mounted on the one end of the laser pointer body, and the second magnet is mounted on the one side of the protective shell, so that the protective shell can be stably mounted on the rectangular plate by suction of the first magnet and the second magnet, and it is also convenient to disassemble the protective shell.

BRIEF DESCRIPTION OF THE DRAWINGS

In order to more clearly illustrate the technical solutions of the embodiments of the present disclosure, accompanying drawings to be used in the embodiments will be briefly described below. It should be understood that the following drawings only show some embodiments of the present disclosure, and therefore it should not be regarded as a limitation of the scope. And for a person of ordinary skill in the art, other relevant drawings may be obtained from these drawings without creative labor.

Figure 1:
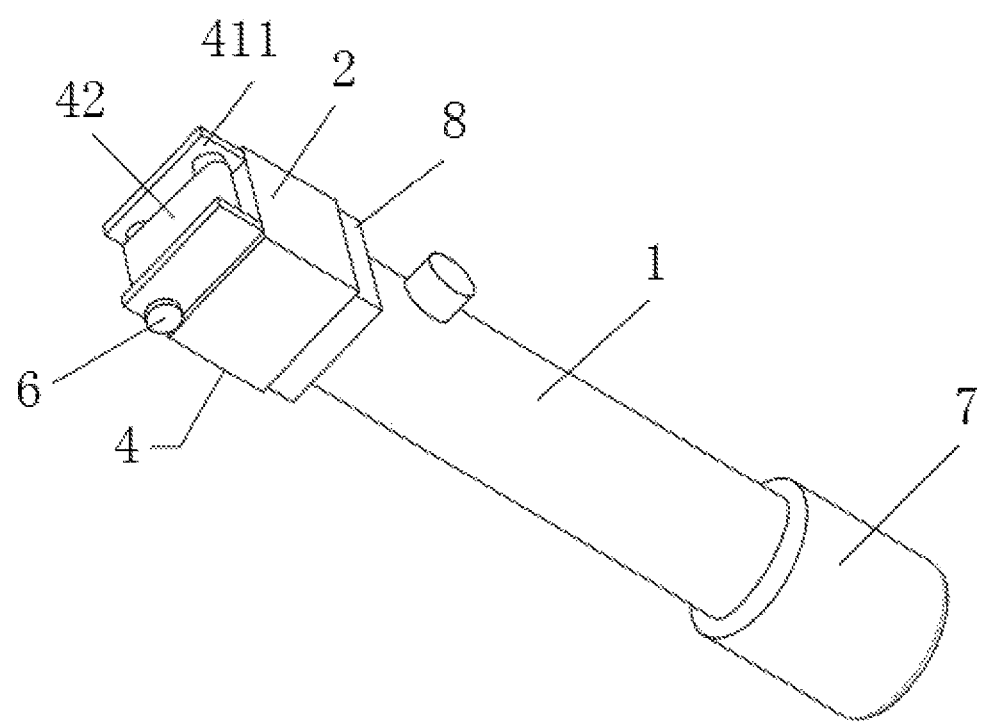
FIG. 1 shows a structural schematic diagram of a main view structure of a handheld USB wireless charging high power laser pointer with variable patterns in accordance with some embodiments of the present disclosure.

In the drawings, reference signs are as follows. 1. laser pointer body, 2. protective shell, 3. wireless charging mechanism, 31. USB charging interface, 311. storage battery, 4. pattern changing mechanism, 41. roller, 411. diaphragm, 42. pattern film, 5. strut, 6. rotating disk, 7. protective cover, 8. rectangular plate, 9. first magnet, 10. second magnet, 11. circuit board, 12. lamp base.

DETAILED DESCRIPTION OF THE EMBODIMENTS

In order to make the objectives, the technical solutions, and the advantages of the embodiments of the present disclosure clearer, the technical solutions in the embodiments of the present disclosure will be described clearly and completely in the following in conjunction with the accompanying drawings in the embodiments of the present disclosure. Obviously, the described embodiments are a part of the embodiments of the present disclosure and not all of the embodiments. Based on the embodiments in the present disclosure, all other embodiments obtained by the person of ordinary skill in the art without making creative labor fall within the scope of protection of the present disclosure.

Figure 2:
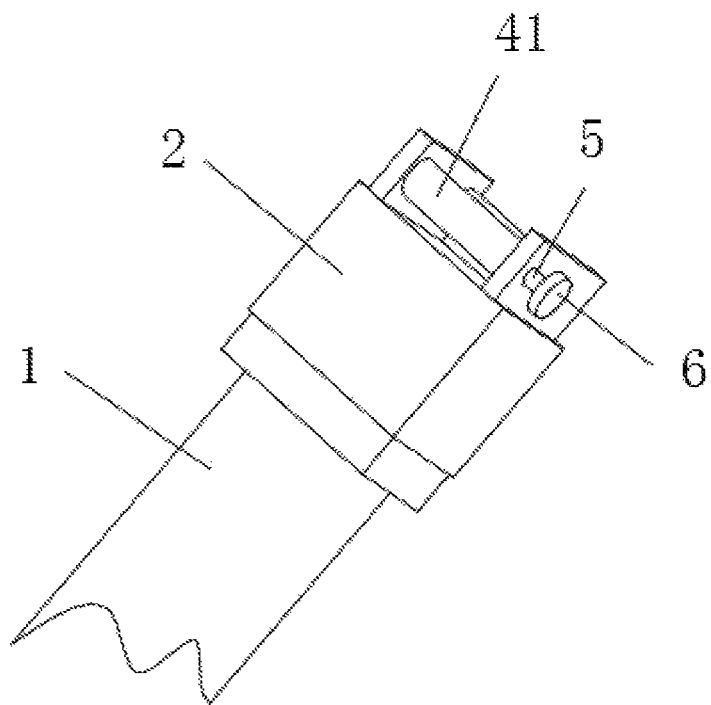
FIG. 2 shows a location diagram of a strut in accordance with some embodiments of the present disclosure.
Figure 3:
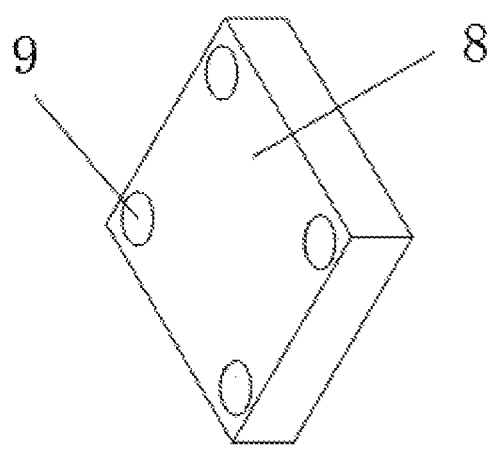
FIG. 3 shows a structural schematic diagram of a rectangular plate in accordance with some embodiments of the present disclosure.
Figure 4:
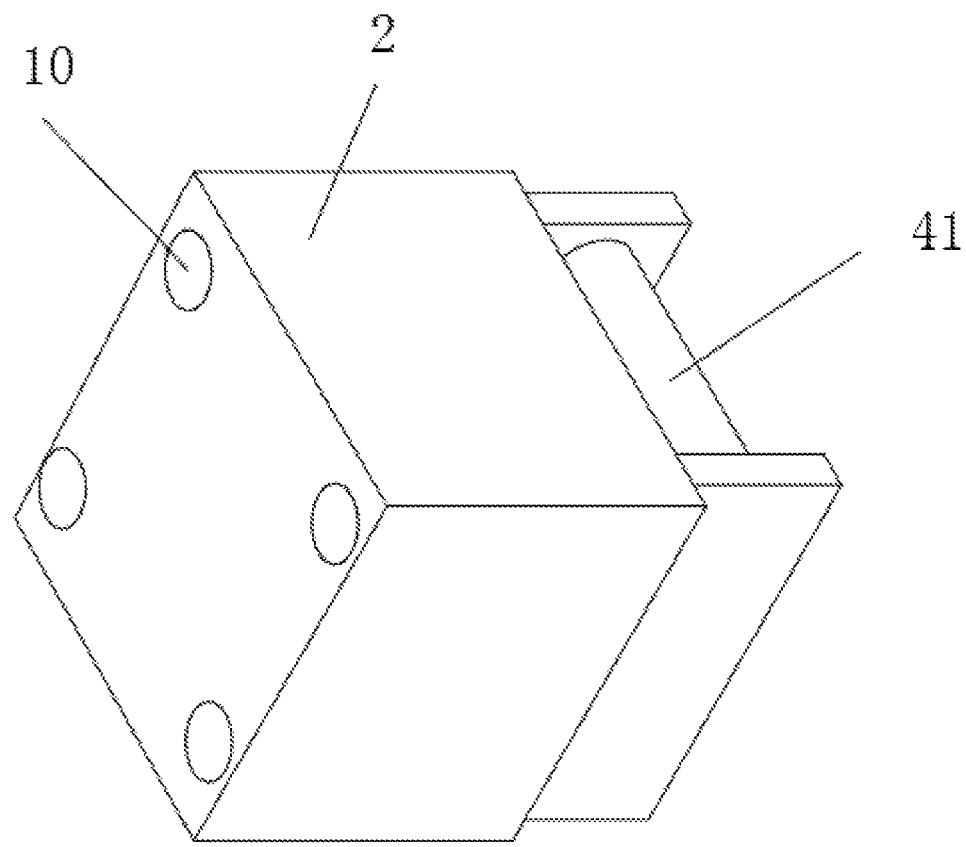
FIG. 4 shows a structural schematic diagram of a protective shell in accordance with some embodiments of the present disclosure.
Figure 5:
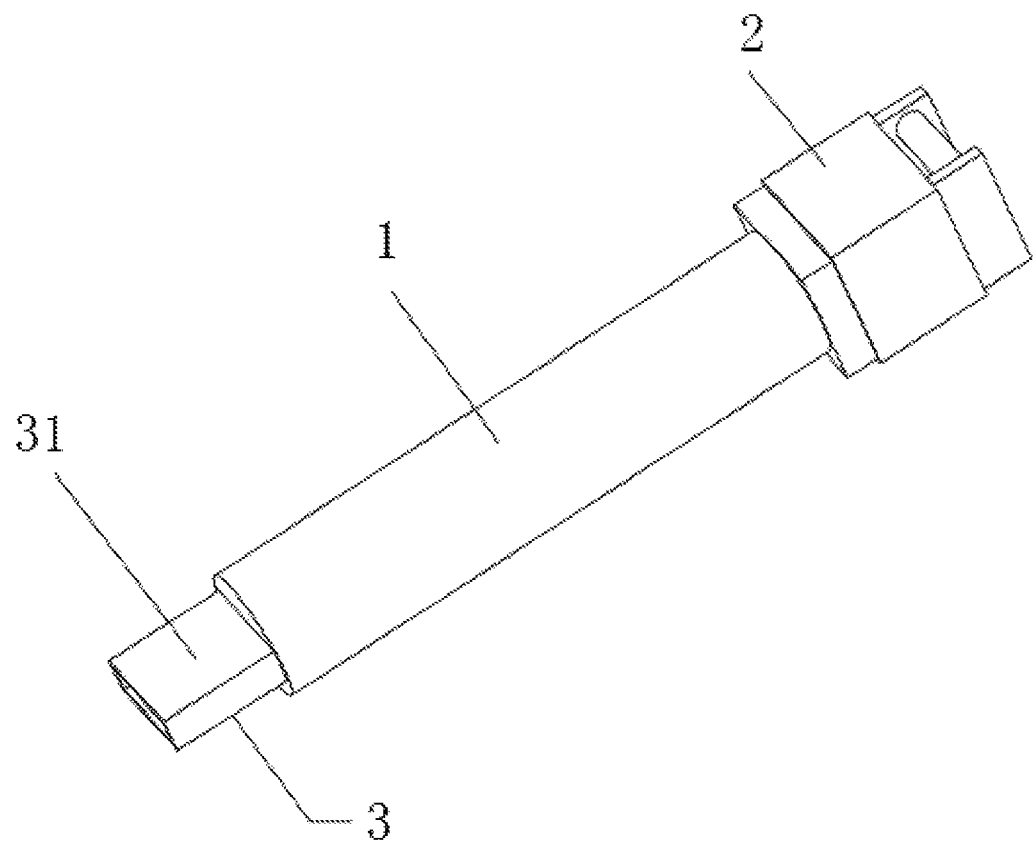
FIG. 5 shows a location diagram of a USB charging interface in accordance with some embodiments of the present disclosure.
Figure 6:
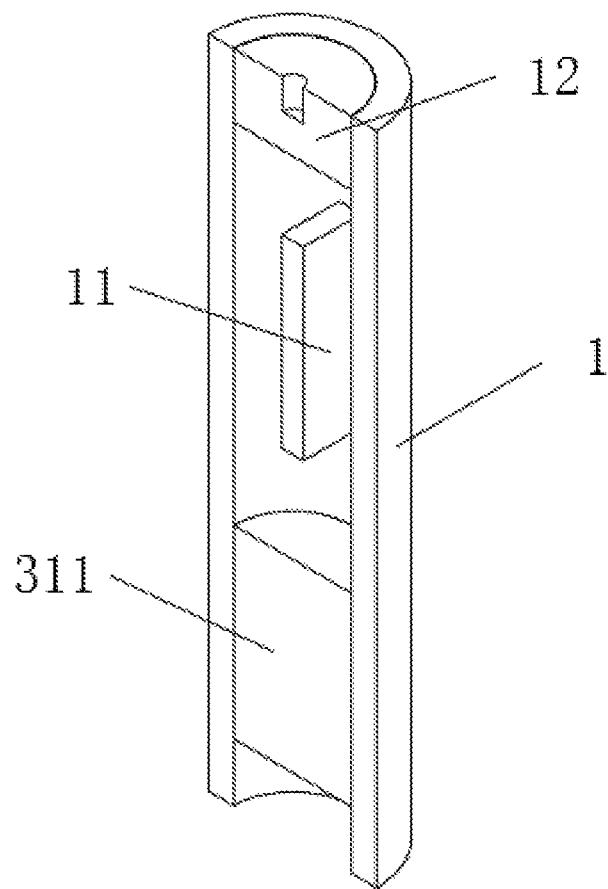
FIG. 6 shows an internal structure diagram of a laser pointer body in accordance with some embodiments of the present disclosure.

Referring to FIG. 1 to FIG. 6, in some embodiments of the present disclosure, a handheld USB wireless charging high power laser pointer with variable patterns is provided, including a laser pointer body 1, a wireless charging mechanism 3 and a pattern changing mechanism 4. The laser pointer body 1 is fitted with a protective shell 2 at one end, and the wireless charging mechanism 3 includes a USB charging interface 31. The laser pointer body 1 is internally fixedly connected to a storage battery 311, and the storage battery 311 is electrically connected to the USB charging interface 31. The pattern changing mechanism 4 includes a roller 41, the protective shell 2 is configured to be fixedly connected to a diaphragm 411 at one end face, and the diaphragm 411 is rotationally connected to the roller 41 at an inner side. A pattern film 42 is winded around an outer surface of the roller 41, and the pattern film 42 is configured to correspond to a position of one end of the protective shell 2.

In a preferred embodiment of the present disclosure, one end of the roller 41 is fixedly connected to a strut 5, and the strut 5 is configured to run through an interior of the diaphragm 411 and fixedly connected to a rotating disk 6.

In a preferred embodiment of the present disclosure, one end of the laser pointer body 1 is threaded to a protective cover 7, threaded rings are provided on an inner wall of the protective cover 7, and the protective cover 7 covers an exterior of the USB charging interface 31.

In a preferred embodiment of the present disclosure, the laser pointer body 1 is fixedly connected to a rectangular plate 8 on an outer surface of one end, and the laser pointer body 1 runs through an interior of the rectangular plate 8.

In a preferred embodiment of the present disclosure, the rectangular plate 8 is configured with grooves at positions of four corners on one side, and a first magnet 9 is fixedly connected to an inside of the grooves.

The protective shell 2 has a rectangle shape, and a second magnet 10 is embedded internally into one side of the protective shell 2. The first magnet 9 corresponds to the second magnet 10 in position, and the first magnet 9 and the second magnet 10 have opposite magnetic poles. The laser pointer body 1 is internally fixedly connected to a circuit board 11, the circuit board 11 is electrically connected to a storage battery 311 and a lamp base 12.

Specifically, a working process or working principle of the handheld USB wireless charging high power laser pointer with variable patterns is described as follows. Currently on the market a power of the laser pointer is relatively low, only 0.39 MV, the laser pointer is charged either with a battery, or with a charging cable, which is more troublesome, the function is relatively single, and the pattern can not be changed. Therefore, the present disclosure designed a novelty device to solve the problems (herein the device is the handheld USB wireless charging high power laser pointer with variable patterns described above), specific operations are as follows. when the laser pointer body 1 is used, a control switch on the laser pointer body 1 can be operated to turn on the lamp base 12 to emit light, because an inner part of the protective shell 2 is hollow and its two ends are open, and the pattern film 42 corresponds to the lamp base 12 in position, thus the lamp base 12 can be directly irradiated on the pattern film 42, patterns on the pattern film 42 will be displayed. If the patterns to be irradiated needs to be changed during use, the rotating disk 6 can be controlled to rotate, then the roller 41 can be driven to rotate, so as to make the pattern film 42 move. By moving the patterns at other positions on the pattern film 42 to positions corresponding to the lamp base 12, other patterns can be irradiated to satisfy uses.

If the storage battery 311 inside the laser pointer body 1 runs out of power, the USB charging interface 31 on the laser pointer body 1 can be directly plugged into an external USB interface to charge the storage battery 311, which can effectively replace manners of filling batteries or charging with a charging cable, so as to satisfy uses. The device facilitates charging of the laser pointer body 1, meanwhile the pattern film 42 is provided at one end of the protective shell 2, which can facilitate changing of patterns and satisfy uses.

For the device of the present disclosure, by detaching the protective shell 2 from the laser pointer body 1 and separating the first magnet 9 from the second magnet 10, the protective shell 2 can be disassembled from the laser pointer body 1, and after the protective shell 2 is removed, a single point 30 MW high power laser is available.

It should be noted that the laser pointer body 1 is a device or apparatus that exists in existing technologies, or a device or apparatus that may be realized in the existing technologies, and its power supply, specific composition, and its principles are clear to those skilled in the art, so it will not be repeated in detail.

What is claimed is:

1. A handheld USB wireless charging high power laser pointer with variable patterns, comprising:
   a laser pointer body (1), configured to be fitted with a protective shell (2) at one end;
   a wireless charging mechanism (3), comprising:

a USB charging interface (31), the laser pointer body (1) is internally fixedly connected to a storage battery (311), and the storage battery (311) is electrically connected to the USB charging interface (31);

a pattern changing mechanism (4), comprising:
  a roller (41), the protective shell (2) is configured to be fixedly connected to a diaphragm (411) at one end face, and the diaphragm (411) is rotationally connected to the roller (41) at an inner side; and
  a pattern film (42), configured to be winded around an outer surface of the roller (41), and the pattern film (42) is configured to correspond to a position of one end of the protective shell (2);

wherein one end of the roller (41) is fixedly connected to a strut (5), and the strut (5) is configured to run through an interior of the diaphragm (411) and fixedly connected to a rotating disk (6);

wherein one end of the laser pointer body (1) is threaded to a protective cover (7), threaded rings are provided on an inner wall of the protective cover (7), and the protective cover (7) covers an exterior of the USB charging interface (31);

wherein the laser pointer body (1) is fixedly connected to a rectangular plate (8) on an outer surface of one end, and the laser pointer body (1) runs through an interior of the rectangular plate (8); and wherein the rectangular plate (8) is configured with grooves at positions of four corners on one side, and a first magnet (9) is fixedly connected to an inside of the grooves.

2. The handheld USB wireless charging high power laser pointer with variable patterns according to claim 1, wherein the protective shell (2) has a rectangle shape, and a second magnet (10) is embedded internally into one side of the protective shell (2).

3. The handheld USB wireless charging high power laser pointer with variable patterns according to claim 2, wherein the first magnet (9) corresponds to the second magnet (10) in position, and the first magnet (9) and the second magnet (10) have opposite magnetic poles.

4. The handheld USB wireless charging high power laser pointer with variable patterns according to claim 3, wherein the laser pointer body (1) is internally fixedly connected to a circuit board (11), the circuit board (11) is electrically connected to a storage battery (311) and a lamp base (12).

* * * * *